United States Patent [19]
Goto

[11] Patent Number: 5,430,788
[45] Date of Patent: Jul. 4, 1995

[54] SPECIFIC REGION EXTRACTION METHOD OF MEDICAL IMAGE

[75] Inventor: Yoshihiro Goto, Tokyo, Japan

[73] Assignee: Hitachi Medical Corporation, Tokyo, Japan

[21] Appl. No.: 111,501

[22] Filed: Aug. 24, 1993

[30] Foreign Application Priority Data

Aug. 28, 1992 [JP] Japan .................. 4-251986

[51] Int. Cl.⁶ ........................... H05G 1/64
[52] U.S. Cl. ................. 378/98.12; 378/98.5; 378/4
[58] Field of Search ......... 378/4, 62, 98.5, 98, 378/162, 163, 901, 98.11, 98.12

[56] References Cited
U.S. PATENT DOCUMENTS
4,624,007 11/1986 Muranushi ......................... 378/4

Primary Examiner—David P. Porta
Assistant Examiner—Don Wong
Attorney, Agent, or Firm—Antonelli, Terry, Stout & Kraus

[57] ABSTRACT

A specific region extraction method of a medical image includes a step of displaying an image selected by a user from among a plurality of tomographic plane images aligned in a predetermined direction, on a display, generating a plurality of sectional plane images by designating a plurality of sectional positions for the tomographic plane image displayed, tracing a profile of a focus in each sectional plane image by using a data input device by a user, and determining profile data of a specific region in each tomographic plane image using coordinates of pixel data extracted by the tracing operation by interpolation.

3 Claims, 4 Drawing Sheets

SPECIFIC REGION EXTRACTION METHOD OF MEDICAL IMAGE

BACKGROUND OF THE INVENTION

This invention relates to a specific region extraction method of a medical image which extracts a specific region such as a focus from among a large number of CT images detected from, and generated for, a diagnostic portion of a subject by an image diagnostic apparatus such as an X-ray CT apparatus, an MRI apparatus, etc. More particularly, it relates to a specific region extraction method which can reduce work amounts when a profile of a specific region is extracted using an input device in an image processor.

A specific region extraction method according to the prior art sequentially reads out and displays CT images corresponding to expansion of a focus in a direction of a body axis, and traces one by one those profiles in which the focus appears, using a mouse. Therefore, when a large number of CT images read out exist such as dozens of CT images, pixel data must be extracted by tracing one by one all these CT images. Therefore, an operator must carry out the operations of reading and displaying required CT images by operating the image processor and tracing the profile of the focus using the mouse, and must repeat these operations for dozens of the CT images. The work amounts in this case are indeed enormous. Accordingly, the operation of extracting the specific region of the medical image requires an extended period of time, and inspection efficiency drops.

SUMMARY OF THE INVENTION

To cope with the problems with the prior art described above, the present invention aims at providing a specific region extraction method of a medical image capable of reducing work amounts when a profile of a specific region of a medical image is traced and extracted using an input device in an image processor.

To accomplish the object described above, the specific region extraction method of a medical image according to the present invention involves the steps of displaying an arbitrary image selected from a large number of tomographic plane images, for example, CT images, generated by collecting detection data for a diagnostic portion of a subject by an image diagnostic apparatus and executing image re-construction processing, on a display, designating sectional positions at a plurality of positions for the CT image thus displayed, by an input device so as to produce a plurality of sectional plane images, tracing the profile representing a specific region in these sectional plane images by an input device, and determining coordinates of other points representing a profile of a focus on each CT image using the coordinates of pixel data extracted by this tracing operation by interpolation by a computer so as to extract the specific region inside the CT image.

Having the construction as described above, the present invention can extract profile points of a specific region for each of dozens of CT images by merely tracing the profile representing the specific region in a plurality of sectional plane images by the input device. For this reason, it is necessary in the present invention only to repeat the tracing operation in the number of times corresponding to the number of sectional positions designated for a certain CT image, and in this way, the work amounts can be drastically reduced. Accordingly, the operation of extracting the specific region in the medical image can be completed within a short time, and inspection efficiency can be improved.

DESCRIPTION OF THE PREFERRED EMBODIMENTS

Hereinafter, preferred embodiments of the present invention will be described in detail with reference to the accompanying drawings.

Figure 1:
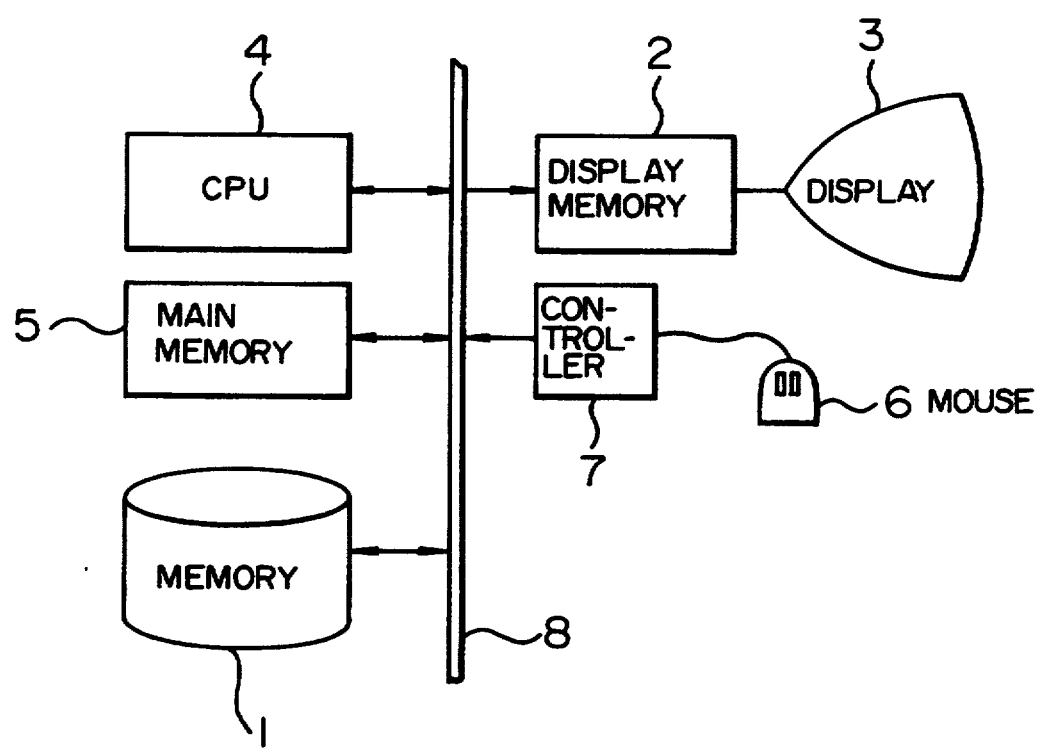
FIG. 1 is a block diagram showing an image processor used for practicing a specific region extraction method according to the present invention.

FIG. 1 is a block diagram showing the construction of an image processor used for practicing the specific region extraction method of the present invention. In the drawing, a memory 1 inputs and stores a large number of CT images detected and generated by an external apparatus such as an X-ray CT apparatus for a diagnostic portion of a subject, and comprises a magnetic tape or a magnetic disk. A display memory 2 temporarily stores the data of the CT images read out from the memory 1 before they are displayed. A display 3 reads out the image data from the display memory 2 and displays the CT image on its screen, and comprises a CRT, for example. A CPU 4 is a central processing unit which controls this image processor as a whole. A main memory 5 stores data and information necessary for the control operation by the CPU 4, and direct address designation can be made by the CPU 4. A mouse 6 is an input device for inputting the data and information from outside, and is controlled by a controller 7. In FIG. 1, reference numeral 8 denotes a data bus.

Figure 2:
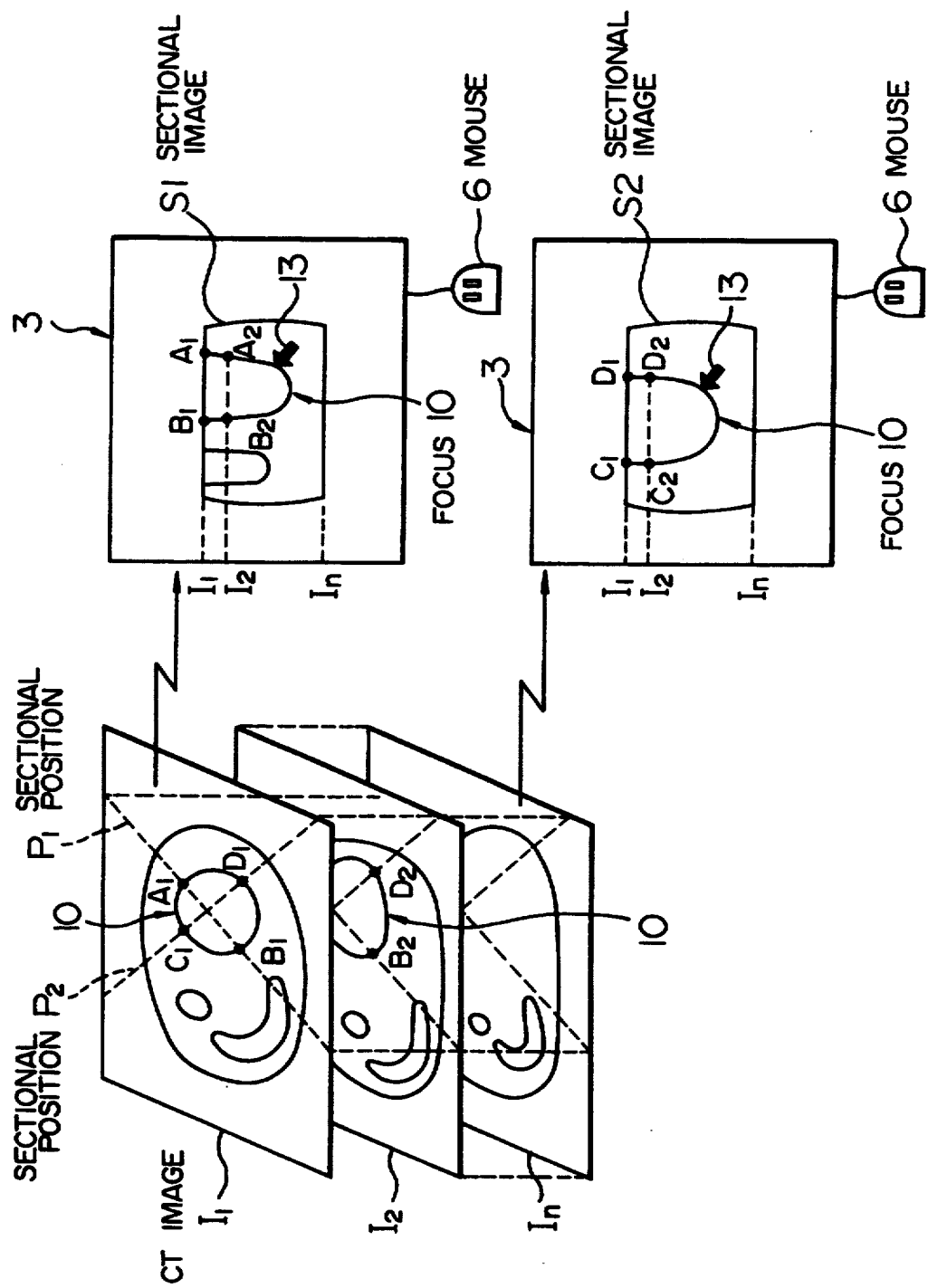
FIG. 2 is a schematic view useful for explaining the principle of the specific region extraction method according to the present invention.

Next, the principle of the present invention will be explained with reference to FIG. 2. It will be hereby assumed that a large number of CT images obtained by measuring a diagnostic portion of a subject are stored. These CT images are represented by symbols $I_1, I_2, \ldots, I_n$ in FIG. 2, and represent a focus 10, respectively. Under such a state, the first CT image $I_1$, for example, is displayed on the display 3 and a first sectional position $P_1$ is designated in such a manner as to transversely cross this focus 10. When pixel values existing on the first sectional position $P_1$ are aligned for each CT image $I_1$ to $I_n$ in the order of $I_1$ to $I_n$, there is obtained a first sectional plane image $S_1$ under the state where the CT images $I_1$ to $I_n$ are sliced at the first sectional position $P_1$, and this sectional plane image $S_1$ is displayed on the display 3. At this time, the image of the focus in the depth-wise direction is displayed in the first sectional plane image $S_1$. Next, the profile of the focus 10 in the first sectional plane image $S_1$ is traced with an arrow 13 controlled by the mouse 6 in the image under this state. This first trace operation extracts two points $A_1$ and $B_1$ in the first CT image $I_1$ and two points $A_2$ and $B_2$ in the second CT image $I_2$, for example. Accordingly, when the profile of the focus 10 in the sectional plane image $S_1$ is traced by the mouse 6, the profile points of the focus 10 at the sectional position $P_1$ can be extracted for each of dozens of CT images $I_1$ to $I_n$.

The following two methods are available for inputting the data by this tracing operation:

1. A tracing method which effects tracing in such a manner that the points representing the profile are continuously inputted to the controller 7.
2. A tracing method which causes a user to plot a plurality of points representing the profile, and determines the points representing the profile by interpolation of a spline function using the plotted points.

Next, in the display of the first CT image $I_1$ described above, a second sectional position $P_2$ describing an arbitrary angle with the first sectional position $P_1$ is designated in such a manner as to transversely cross the focus 10. When the pixel values existing on the second sectional position $P_2$ are aligned in the order of $I_1$ to $I_n$ for each of the CT images $I_1$ to $I_n$ in the same way as described above, there is obtained the second sectional plane image $S_2$ under the state where each CT image $I_1$ to $I_n$ is sliced at the second sectional position $P_2$, and this image $S_2$ is displayed on the display 3. At this time, the image of the focus 10 in the depth-wise direction when viewed from different angular directions is displayed in the second sectional plane image $S_2$. Next, the profile of the focus 10 in the second sectional plane image $S_2$ is traced with the arrow 13 controlled by the mouse 6 in the image. This single tracing operation extracts two points $C_1$ and $D_1$ in the first CT image $I_1$, for example, and two points $C_2$ and $D_2$ in the second CT image $I_2$. Accordingly, when the profile of the focus 10 in the sectional plane image $S_2$ is merely traced once with the mouse 6, the profile points at the sectional position $P_2$ can be extracted for each of dozens of CT images $I_1$ to $I_n$.

When the focus 10 is traced in the two sectional plane images $S_1$ and $S_2$ as described above, four points ($A_1$, $B_1$, $C_1$, $D_1$; $A_2$, $B_2$, $C_2$, $D_2$; ...; $A_n$, $B_n$, $C_n$, $D_n$) can be extracted on the tomographic planes of the focus 10 for each CT image $I_1$, $I_2$, ..., $I_n$. Where rough approximation is permitted, the profile of the focus 10 in the first CT image $I_1$, for example, is approximately determined by spline interpolation using these four points, and its region can be extracted. Similarly, the profiles of the focus 10 are determined approximately by the interpolation calculation using the four points extracted by the tracing operation described above for the other CT images $I_2$ to $I_n$ and the region can thus be extracted.

Figure 3:
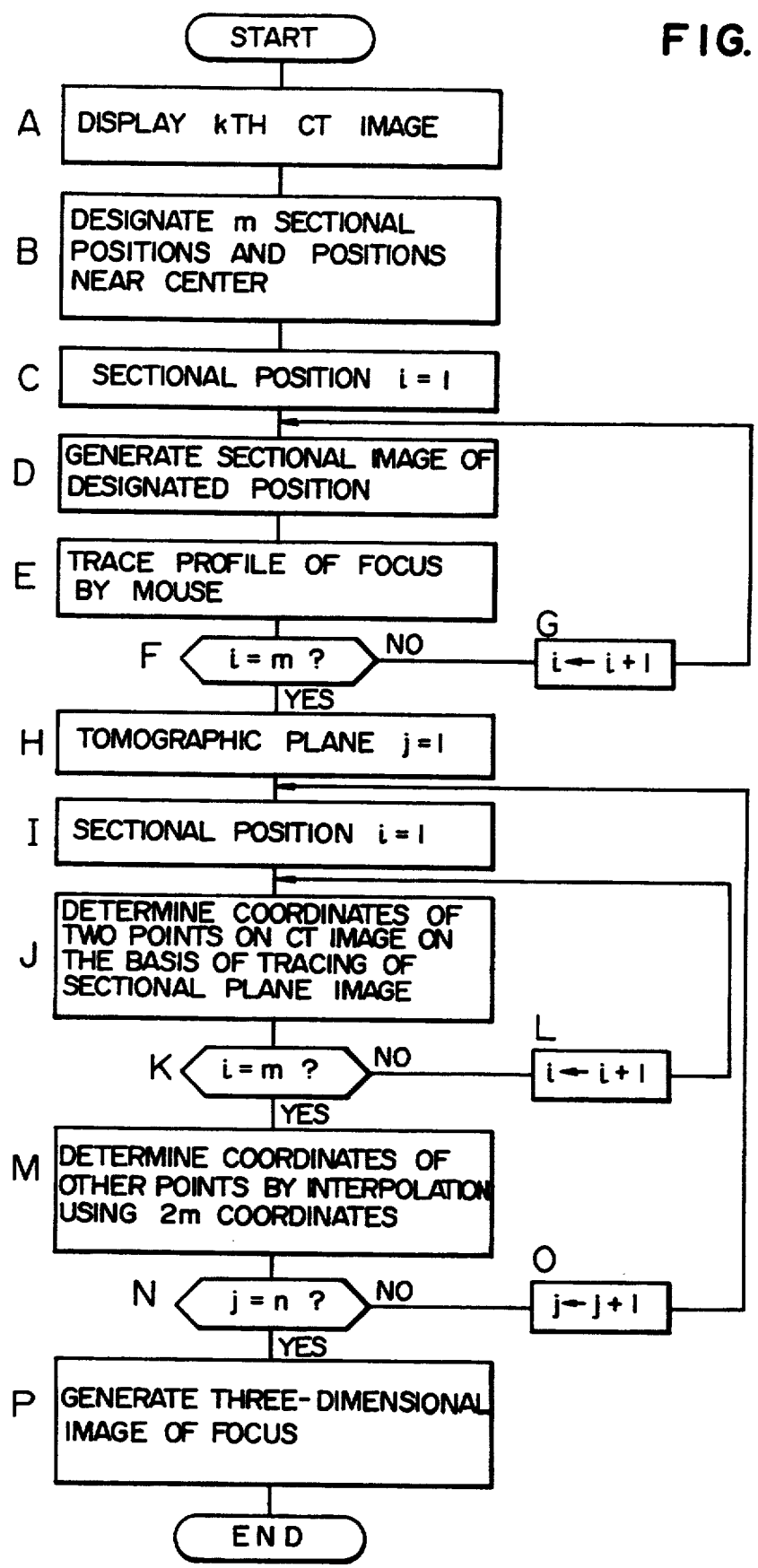
FIG. 3 is a flowchart showing the procedures when the specific region extraction method is carried out in practice.
Figure 4:
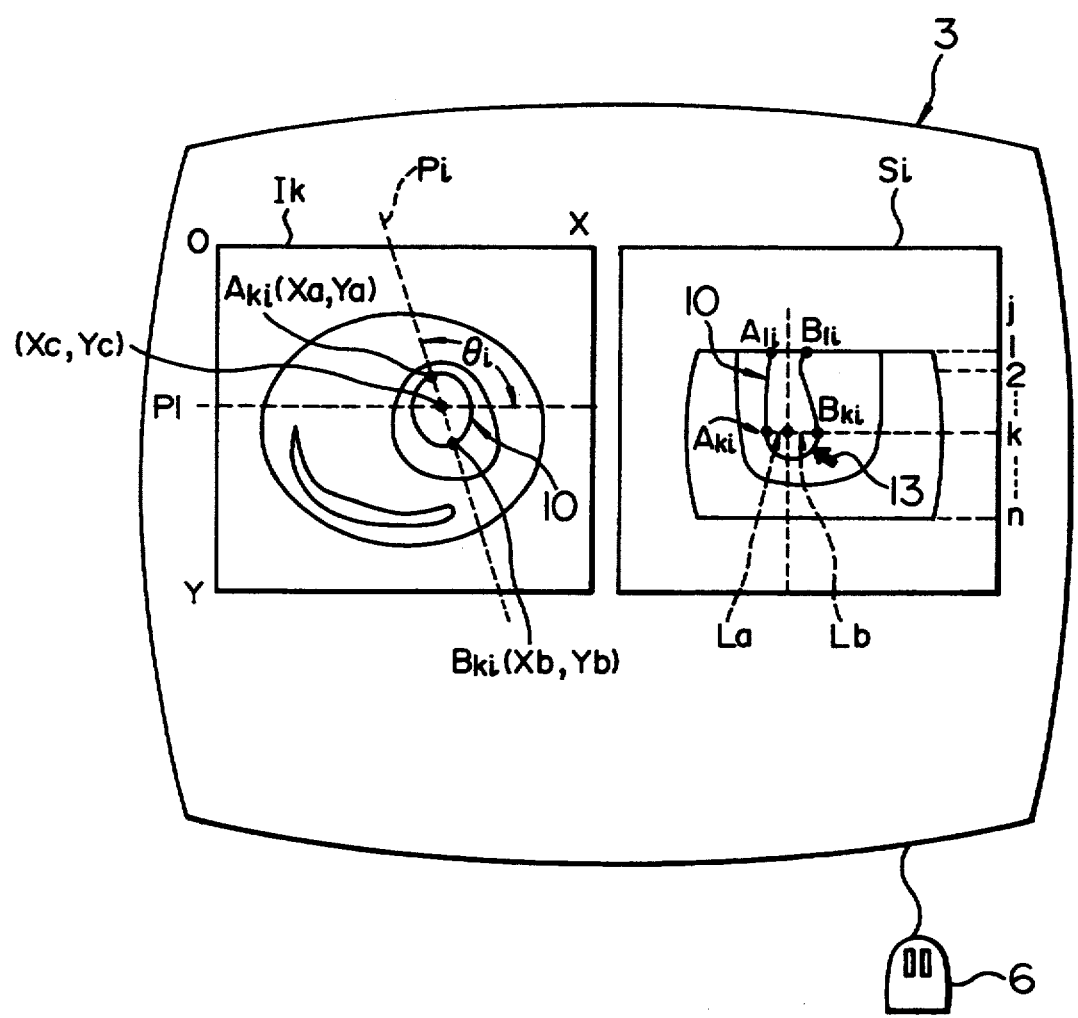
FIG. 4 is a schematic view showing a screen of a display when the method of the invention is practiced.

Next, the procedures for practically carrying out the specific region extraction method of the present invention by the use of the image processor shown in FIG. 1 will be explained with reference to FIGS. 3 and 4. To begin with, the CT images of the subject that are stored in advance are read out from the memory 1 shown in FIG. 1, and the kth CT image $I_k$, which permits detailed observation of the focus 10 as the specific region, is selected from these CT images and is displayed on the screen of the display 3 as shown in FIG. 4 (Step A in FIG. 3). Next, while observing the shape of the focus 10 of the CT image $I_k$ displayed on the display, a user designates the sectional positions i and the number m of the positions using the mouse 6 and at the same time, designates the coordinates (Xc, Yc) near the center of the focus (Step B).

Then, the first sectional position $P_1$ (see FIG. 4) is designated by setting i=1 (Step C). The pixel values on the first sectional position are aligned in the order of $I_1$ to $I_n$ for each CT image $I_1$ to $I_n$ inside the memory 1 shown in FIG. 1, and the sectional plane image corresponding to the first sectional position is generated (Step D). This image is similar to the first sectional plane image $S_1$ shown in FIG. 2. Under this state, the profile of the focus 10 in the first sectional plane image is traced with the arrow 13 controlled by the mouse 6 in the image (Step E). This single tracing operation extracts the profile points of the focus 10 existing on the first sectional position in each CT image $I_1$ to $I_n$. Next, whether or not the procedure proceeds to the number m on the CT image is judged (Step F). Since the procedure merely traces the image of the first sectional position i=1 at this stage, the step F proceeds to the "NO" side. At the next step G, the count of the sectional position i is counted up by one and the flow returns to the Step D. Thereafter, while the Steps D→E→F→G are repeated, the flow proceeds to the image at the mth sectional position, and after the profile of the focus 10 displayed on the image is traced, the Step F proceeds to the "YES" side.

In this way, m sectional plane images are generated and the profiles of the respective focuses 10 are traced. Then, the tomographic plane $I_j$ ($1 \leq j \leq n$) and the sectional position $P_i$ ($1 \leq i \leq m$) are initialized at the next Steps H and I. Among the CT images $I_1$ to $I_n$ containing the focus 10, j=1 is designated at the first tomographic plane (Step H). Next, i=1 is designated as the first sectional position (Step I). Thereafter, the coordinates ($A_{ji}$, $B_{ji}$) of two points on each CT image $I_j$ are determined on the basis of the tracing result obtained for the focus 10 of each sectional plane image $S_i$ as described above (Step J). Here, suffixes j and i represent the data obtained by the tracing operation on the ith tomographic plane image on the jth sectional plane.

It will be assumed in FIG. 4 that the sectional plane image at the ith sectional position $P_i$ designated on the CT image is $S_i$ and the coordinates of two profile points $A_{ki}$ and $B_{ki}$ of the focus 10 are determined for the kth tomographic plane $I_k$ in this sectional plane image $S_i$ with j=k. It will be further assumed that the coordinates of the point $A_{ki}$ are ($X_a$, $Y_a$) and the coordinates of the point $B_{ki}$ are ($X_b$, $Y_b$), and that the ith sectional position $P_i$ crosses the first sectional position $P_1$ having a horizontal angle (0°), with an angle $\theta i$. Further, it will be assumed that the distances from the points $A_{ki}$, $B_{ki}$ to the central point ($X_c$, $Y_c$) are obtained in advance as $L_a$ and $L_b$, respectively, when the tracing operation is carried out using the mouse 6 for the sectional plane image $S_i$. Under such a condition, the X and Y coordinates of the point $A_{ki}$ are expressed by the following equations where j=k in the suffixes "j and i".

$$X_a(k, i) = X_c + L_a(k, i) \cdot \cos(\theta i) \quad (1)$$

$$Y_a(k, i) = Y_c - L_a(k, i) \cdot \sin(\theta i) \quad (2)$$

Similarly, the X and Y coordinates of the point B are expressed by the following equation.

$$X_b(k, i) = X_c + L_b(k, i) \cdot \cos(\theta i + 180°) \quad (3)$$

$$Y_b(k, i) = Y_c - L_b(k, i) \cdot \sin(\theta i + 180°) \quad (4)$$

At first, the coordinates of the two points $A_{k1}$ and $B_{k1}$ are determined at the Step J by setting i=1 in the equations (1) to (4) given above.

Next, whether or not the sectional position on the CT image proceeds to m is judged (Step K). Since only the coordinates of the two points $A_{k1}$ and $B_{k1}$ have so far been determined as to the angular direction of the first sectional position i=1, the Step K proceeds to the "NO" side. Next, the count of the sectional position i is counted up by one at the next Step L, and after the sectional position $P_2$ (i=2) is designated, the flow returns to the Step J. The coordinates of $A_{k2}$ and $B_{k2}$ are determined at the Step J. In this way, i is changed to i=1, 2, ..., m on the tomographic plane $I_k$ while repeating the Steps J→K→L, the coordinates of two points are determined at each sectional position in accordance with the equations (1) to (4). Thereafter, the Step K proceeds to the "YES" side.

In this way, 2m profile points of the focus 10 on the kth tomographic plane $I_k$ are determined.

Other points representing the profile of the focus 10 are determined by spline interpolation, for example, by the CPU 4 shown in FIG. 1 using the 2m coordinates obtained at the Steps I, J, K and L (Step M). In this way, the focus 10 on the kth tomographic plane $I_k$ can be extracted as the specific region.

Next, whether or not the processing which determines the coordinates of two points by changing the sectional position from i=1 to m has been completed for the nth tomographic plane is judged (Step N). When j<n, the flow proceeds to the Step O, where the count of the tomographic plane j is counted up by one and then the flow returns to the Step I.

At the Steps I, J, K and L, the coordinates A(k+1, i), B(k+1, i) at the respective sectional positions are determined for the (k+1)th tomographic plane $I_{k+1}$ by changing the sectional position from i=1 to m.

At the Step M, the coordinates of other points representing the profile of the focus 10 are determined by spline interpolation for the (k+1)th tomographic plane $I_{k+1}$ in the same way as described above.

The Steps I, J, K, L, M, N and O are repeated and the specific regions of the focus 10 are extracted for the tomographic planes $I_1, I_2, \ldots, I_n$, respectively, and then the Step N proceeds to the Step P. At this Step P, the pixel data of the specific region of the focus 10 thus extracted are piled up in the direction of the body axis, and a three-dimensional image of the focus 10 is generated.

I claim:

1. A specific region extraction method of a medical image comprising:
    (a) a step of displaying an image selected by a user from among a plurality of tomographic plane images aligned in a predetermined direction, on a display;
    (b) a step, carried out by said user, for designating a plurality of sectional positions for said tomographic plane image displayed;
    (c) a step of generating a plurality of sectional plane images corresponding to said plurality of said sectional positions designated;
    (d) a step, carried out by said user, for tracing a first profile of a specific region in said sectional plane images, using a data input device for each of said plurality of said sectional plane images; and
    (e) a step of determining coordinates of other points representing a second profile of said specific region on said tomographic plane images by using coordinates of pixel data extracted in said step of tracing, by interpolation using a computer.

2. A specific region extraction method of a medical image according to claim 1, wherein said step of determining said other points representing said second profile by interpolation includes a step of determining them by spline interpolation.

3. A specific region extraction method of a medical image according to claim 1, wherein said tracing step includes:
    a step of inputting a plurality of points representing said first profile; and
    a step of determining coordinates of points representing said first profile by spline interpolation.

* * * * *